United States Patent
Evans et al.

(10) Patent No.: US 7,313,158 B2
(45) Date of Patent: Dec. 25, 2007

(54) INTEGRATED HIGH SPEED MODULATOR FOR GRATING-OUTCOUPLED SURFACE EMITTING LASERS

(75) Inventors: Gary Alan Evans, Plano, TX (US); Taha Masood, Plano, TX (US); Steven Gregory Patterson, Plano, TX (US); Nuditha Vibhavie Amarasinghe, Richardson, TX (US); Jerome K. Butler, Richardson, TX (US)

(73) Assignee: Photodigm, Inc., Richardson, TX (US)

( * ) Notice: Subject to any disclaimer, the term of this patent is extended or adjusted under 35 U.S.C. 154(b) by 296 days.

(21) Appl. No.: 11/055,128

(22) Filed: Feb. 8, 2005

(65) Prior Publication Data
US 2006/0176915 A1    Aug. 10, 2006

(51) Int. Cl.
*H01S 5/00* (2006.01)
*H01S 3/13* (2006.01)
*H01S 3/08* (2006.01)

(52) U.S. Cl. .................. 372/50.124; 372/29.016; 372/29.023; 372/102

(58) Field of Classification Search .......... 372/50.124, 372/96, 102
See application file for complete search history.

(56) References Cited
U.S. PATENT DOCUMENTS

| | | | | |
|---|---|---|---|---|
| 4,958,375 A | * | 9/1990 | Reilly et al. ............ | 382/159 |
| 4,993,036 A | * | 2/1991 | Ikeda et al. ............ | 372/50.12 |
| 5,164,956 A | * | 11/1992 | Lang .................... | 372/96 |
| 5,602,863 A | * | 2/1997 | Itagaki ................. | 372/50.21 |
| 5,657,407 A | * | 8/1997 | Li et al. ............... | 385/37 |
| 5,930,278 A | * | 7/1999 | Menigaux .............. | 372/50.121 |
| 5,970,081 A | * | 10/1999 | Hirayama et al. ....... | 372/96 |
| 6,018,540 A | * | 1/2000 | Kinoshita .............. | 372/46.01 |
| 6,104,739 A | * | 8/2000 | Hong et al. ............ | 372/50.11 |
| 6,201,824 B1 | * | 3/2001 | Hong et al. ............ | 372/50.11 |
| 6,459,715 B1 | * | 10/2002 | Khalfin et al. .......... | 372/50.22 |
| 6,888,874 B2 | * | 5/2005 | Masood et al. .......... | 372/96 |
| 2002/0126942 A1 | * | 9/2002 | Evans .................. | 385/14 |
| 2002/0136259 A1 | * | 9/2002 | Evans .................. | 372/102 |

* cited by examiner

*Primary Examiner*—Minsun Oh Harvey
*Assistant Examiner*—Phillip Nguyen
(74) *Attorney, Agent, or Firm*—Duke W. Yee; Theodore D. Fay, III

(57) ABSTRACT

A single-mode grating-outcoupled surface emitting (GSE) semiconductor laser architecture is provided. This architecture enables high speed modulation of the GSE laser, which is accomplished by only varying the relative phase of counter propagating waves in the outcoupler grating region of the lasing cavity.

16 Claims, 4 Drawing Sheets

INTEGRATED HIGH SPEED MODULATOR FOR GRATING-OUTCOUPLED SURFACE EMITTING LASERS

BACKGROUND OF THE INVENTION

1. Technical Field

The present invention is directed generally toward laser diodes, and more particularly to a grating-outcoupled surface emitting laser with an integrated high speed modulation.

2. Description of the Related Art

Transmission of light through waveguides has been pursued for many types of communications applications. Light signals offer many potential advantages over electronic signals. Light sources are commonly-created from semiconductor devices, and include semiconductor devices such as light emitting diodes (LED) and laser diodes (LD).

Optical fiber is the most commonly used transmission medium for light signals. A single fiber is capable of carrying several different modulated signals within it at one time. For instance, wavelength division multiplexing divides the used bandwidth of the fiber into different channels, each channel containing a small range of wavelengths, and thus transmits several different wavelengths (or signals) of light at once. Using such a system requires sources for the different wavelengths. More wavelengths on the fiber require more sources to be coupled to the fiber.

Efficient coupling of light into a fiber is simplified if the laser beam has a cross sectional profile that matches the profile of the fiber mode(s). Efficient use of light for communications requires that the light have high temporal coherence. Efficient coupling of light to monomode guides requires spatial coherence. Spatial coherence requires the laser to operate in a single lateral and transverse mode. Temporal coherence requires the laser to operate in a single longitudinal mode and implies a very narrow bandwidth, or range of wavelengths.

The most coherent semiconductor lasers use resonators based on grating feedback rather than Fabry-Perot resonators with reflective end facets. Distributed feedback (DFB) lasers use a Bragg reflective grating covering the entire pumped length of the laser. An alternative to DFB lasers is the use of distributed Bragg reflectors (DBRs) located outside the pumped region.

The Grating-Outcoupled Surface-Emitting (GSE) laser (described in commonly assigned U.S. patent application Ser. Nos. 09/844,484 and 09/845,029, both of which are hereby incorporated by reference), is an essentially planar structure that provides out-of-plane optical emission. The GSE laser has a built in horizontal waveguide that allows on-wafer or on-chip routing and control of light along with emission from the surface of the wafer or chip. In contrast, the light from vertical cavity surface-emitting lasers (VCSELs) is directed normal to the wafer or chip surface and cannot easily be routed within the wafer or chip. The epitaxial structure of a VCSEL is very thick and therefore costly and time consuming to grow, compared to the relatively thin layers making up an edge-emitting (EE) or GSE laser. While EE lasers have a horizontal waveguide and can route light within a wafer or chip, at least one terminating edge (cleaved or etched) is required to access or connect the on-chip light to the outside world. Thus EE lasers are inherently edge-bound (and hence not fully integrable), while VCSELs have incompatibility due to their very special epitaxy requirements.

When the laser is turned on and begins emitting light, photons are introduced into the lasing cavity by applying a current to the lasing cavity. The amount of light, or power, supplied by the laser must ramp up as the density of photons increases in the lasing cavity. Similarly, as the laser is turned off, the amount of power supplied by the laser decreases as the density of photons in the lasing cavity decreases. This process of turning the laser on and off takes time and affects the speed of communication for the laser.

SUMMARY OF THE INVENTION

The present invention recognizes the disadvantages of the prior art and provides a single-mode grating-outcoupled surface emitting (GSE) semiconductor laser architecture. This architecture enables high speed modulation of the GSE laser, which is accomplished by only varying the relative phase of counter propagating waves in the outcoupler grating region of the lasing cavity.

BRIEF DESCRIPTION OF THE DRAWINGS

The novel features believed characteristic of the invention are set forth in the appended claims. The invention itself however, as well as a preferred mode of use, further objects and advantages thereof, will best be understood by reference to the following detailed description of an illustrative embodiment when read in conjunction with the accompanying drawings, wherein:

DETAILED DESCRIPTION

The description of the preferred embodiment of the present invention has been presented for purposes of illustration and description, but is not intended to be exhaustive or limited to the invention in the form disclosed. Many modifications and variations will be apparent to those of ordinary skill in the art. The embodiment was chosen and described in order to best explain the principles of the invention the practical application to enable others of ordinary skill in the art to understand the invention for various embodiments with various modifications as are suited to the particular use contemplated.

Figure 1:
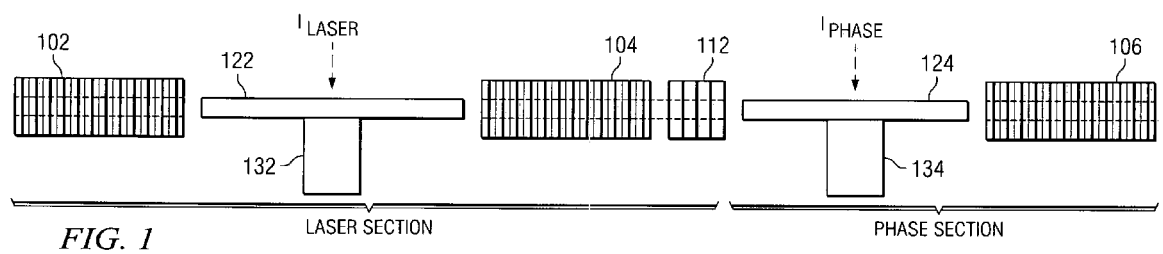
FIG. 1 is a pictorial representation of a grating-outcoupled surface emitting laser device with integrated high speed modulator in accordance with an exemplary embodiment of the present invention.

The present invention provides a single-mode grating-outcoupled surface emitting (GSE) semiconductor laser architecture. This architecture enables high speed modulation of the GSE laser, which is accomplished by only varying the relative phase of the counter propagating waves in the outcoupler grating region of the lasing cavity. FIG. 1 is a pictorial representation of a grating-outcoupled surface emitting laser device with integrated high speed modulator in accordance with an exemplary embodiment of the present invention. In this instance, the device consists of a lasing section and a phase section.

The lasing section consists of a gain region defined by an active ridge that is terminated at each end by a narrow-band, first-order, shallow, distributed Bragg reflector (DBR) 102, 104. DBR 102 is highly reflective (approximately 100%, for example) to only a single Fabry Perot wavelength at one end of the ridge. DBR 104 may be approximately 30% reflective, for example, to the same wavelength at the opposite end. In the lasing section the lasing action takes place between the two DBRs 102, 104 as a standing wave, which results from repeated interference of two counter propagating waves of identical frequency being formed inside the lasing cavity.

Figure 4:
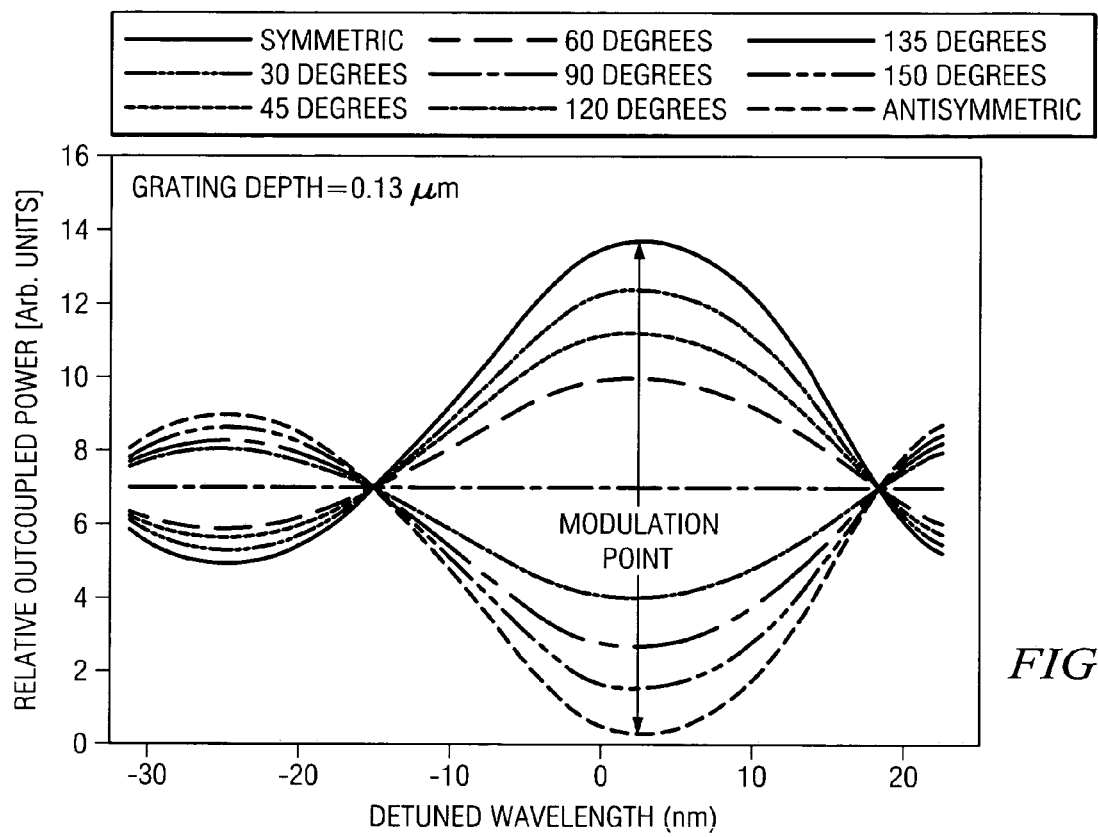
FIG. 4 illustrates the theoretical relative outcoupled power versus detuning.

The second-order outcoupler gratings 112 are placed between the 30 percent reflective distributed Bragg reflector 104 and the phase section of the GSE device. On-resonance these second-order gratings 112 provide wavelength selective feedback and equally convert the incident power into output radiation in the air as well as the substrate. The period of the second-order grating 112 can be positively or negatively detuned from the DBR selected optical wavelength at which the laser operates. Detuning refers to how much the outcoupler wavelength deviates from the DBR wavelength. The main reason for detuning the second-order grating towards shorter or longer wavelengths is to obtain kink-free operation of the GSE laser. As shown in FIG. 4, detuning of −15 or +18 nm for a particular outcoupler grating provides a constant fraction of outcoupled light independent of the relative phases of the waves incident into the outcoupler region. Due to detuning of the outcoupler grating 112, the outcoupled radiation emits in two beams that deviate slightly from the normal axis. If the detuning is small then the output beams overlap, giving rise to a slightly broadened single-lobe far-field compared to the on-reasonance outcoupling far-field. Detuning is desirable for many applications and is especially desireable for GSE lasers that do not contain a phase shift section so that kink-free LI curves are obtained. An LI curve illustrates light output versus forward current.

The phase section of the GSE laser device in FIG. 1 also consists of a ridge region that excites the outcoupler end and has a DBR 106 opposite to the approximately 30% reflective DBR 104 of the same grating period as the DBRs of the laser section.

This GSE device, which has an on-resonance grating outcoupler, is modulated as follows. First the laser section ridge is biased to a fixed current, $I_{LASER}$, above the lasing section threshold. The laser current, $I_{LASER}$, is applied to ridge 122 through contact pad 132. Next the laser is modulated by varying the current, $I_{PHASE}$, of the phase section ridge 124 between two values that are both below the phase section threshold current. The phase current, $I_{PHASE}$, is applied to ridge 124 through contact pad 134. Applying current to the phase section causes the effective index of the phase section to change by a process known as "gain induced index depression" in the active region (or quantum wells). As the relative phase between the counter propagating waves incident into both ends of the outcoupler region varies, the relative position of the standing wave changes with respect to the outcoupler grating teeth. This standing wave forms due to the repeated interference of the counter propagating waves. As the standing wave moves from an in-phase to an out-of-phase position with respect to the grating teeth, the outcoupled power peaks or nulls respectively (if the outcoupling grating is on resonance).

Figure 2:
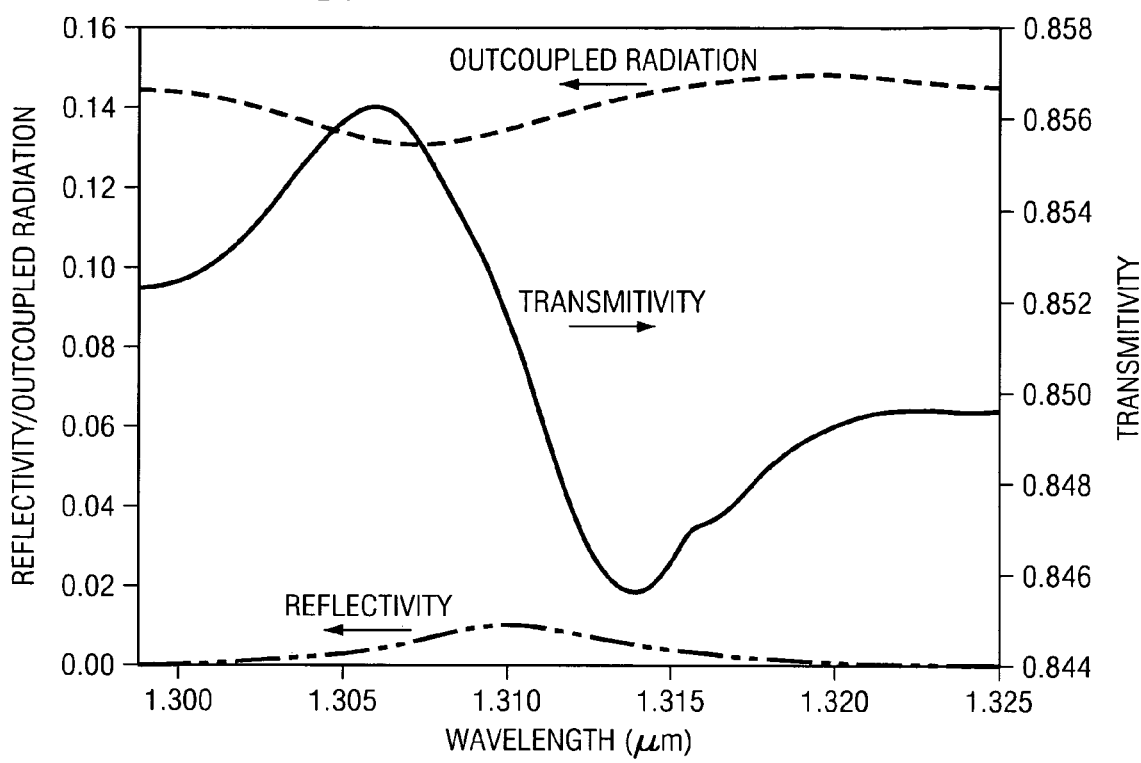
FIG. 2 illustrates the theoretical reflectivity, transmittivity and outcoupled radiation per pass from a grating outcoupler as a function of detuning from resonance.

FIG. 2 illustrates the theoretical reflectivity, transmittlivity and outcoupled radiation per pass as a function of detuning from the Bragg (resonance) condition for a 30 µm long and 0.13 µm deep second-order outcoupler grating formed on a standard 1310 nm epitaxial structure. As shown in FIG. 2, the outcoupled power remains relatively constant as the outcoupler grating is detuned from resonance.

Figure 3A:
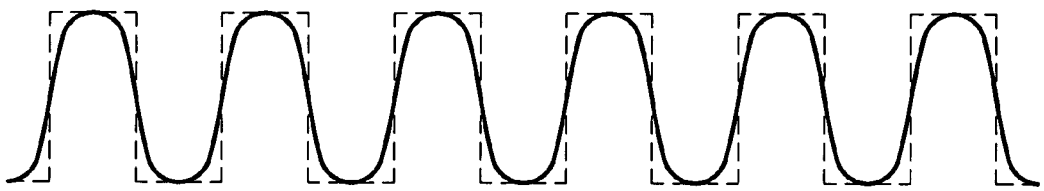
FIGS. 3A and 3B illustrate the symmetric as well as the antisymmetric alignment of the second-order gratings with respect to the on-resonance standing wave.
Figure 3B:
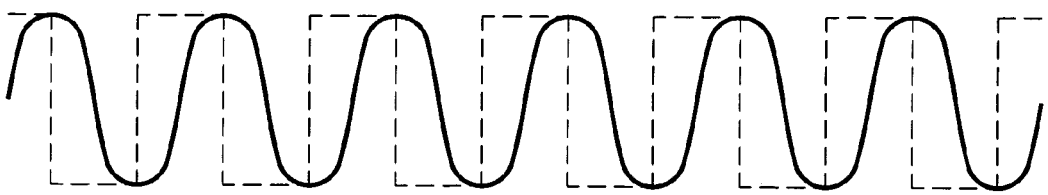

The relative position of the standing wave formed in the outcoupler grating is difficult to control precisely. The two extreme cases of resonant standing-wave mode positions in relation to the second-order outcoupler grating teeth are shown in FIGS. 3A and 3B, which illustrate the symmetric as well as the antisymmetric alignment of the second-order gratings with respect to the on-resonance standing wave in field. In general, a finite length second-order grating outcoupler can have an arbitrary phase relative to the on-resonant standing wave. The position of the grating in relation to the standing wave will then correspond to the forward and backward propagating waves being anywhere from 0 to 180 degrees out-of-phase.

FIG. 4 is a theoretical plot of the outcoupled power versus detuning from the Bragg wavelength for a 15 µm long outcoupler. The power radiated from the outcoupler of a given length is maximum when the outcoupler grating period is on (or very near) the Bragg wavelength and the counter propagating waves entering the outcoupler from each end are in-phase with each other (symmetric mode). The outcoupler does not radiate if the counter propagating waves are 180 degrees out-of-phase (antisymmetric mode). The outcoupled power decreases monotonically as the relative phase of the forward and backward propagating waves varies from 0 to 180 degrees. At 90 degrees out-of-phase, the outcoupled power is reduced by half. The radiated power also decreases as the second-order grating is positively or negatively detuned from the Bragg wavelength and the relative phase between the counter propagating waves is equal to or greater than 0 but less than 90 degrees. On the other hand, the radiated power increases as the second-order outcoupler grating is positively or negatively detuned from the Bragg wavelength and the relative phase between the counter propagating waves is greater than 90 degrees. The power outcoupled does not change with detuning if the forward and backward propagating waves are 90 degrees out-of-phase.

From the plot shown in FIG. 4, one can see that the GSE device can be modulated between in-phase where the outcoupled power is maximum to 180 degrees out-of-phase where the outcoupled power approaches zero. From this plot, one may also notice that if a 15 µm long outcouper is detuned approximately ±18 nm from the lasing wavelength, the outcoupling intensity becomes insensitive to phase variations. At that point the phase of the outcoupled light can be modulated (from 0 to π) without any loss in the outcoupled power. We refer to the outcoupler as being positively detuned when the second-order grating resonance is on the longer side of the DBR selected lasing wavelength. Similarly, the outcoupler is negatively detuned when the second-order grating resonance is on the shorter side of the DBR selected lasing wavelength.

Figure 5:
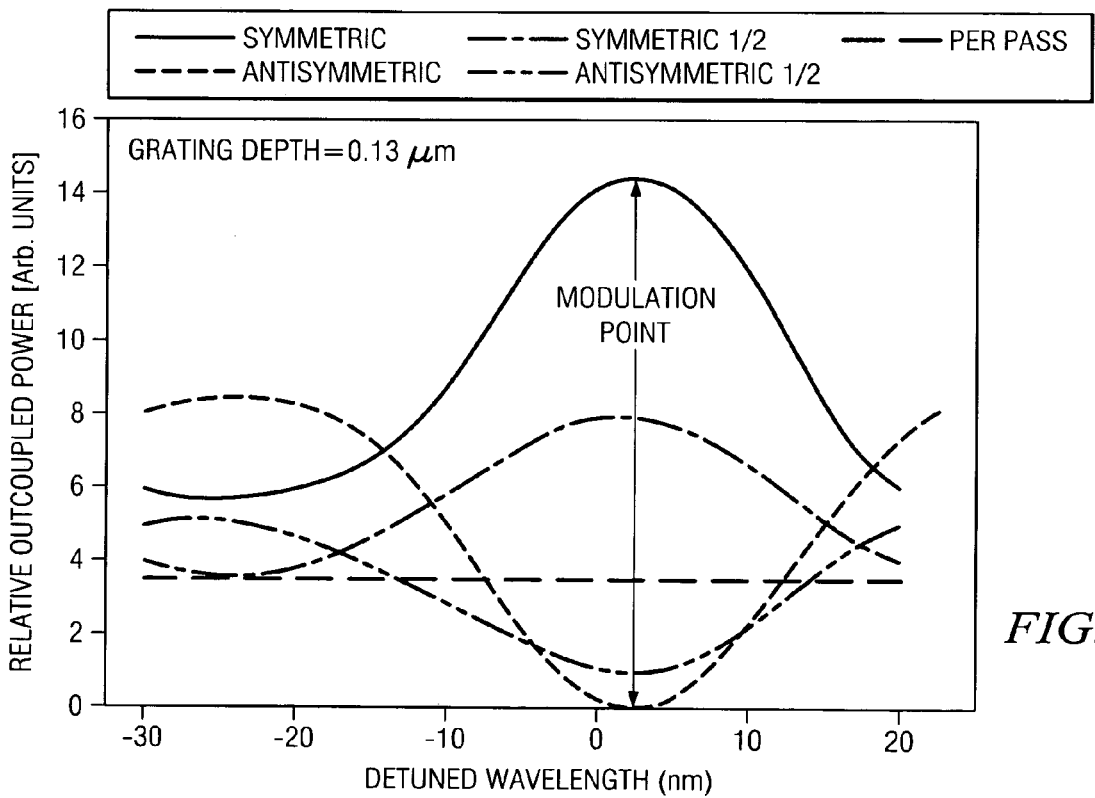
FIG. 5 illustrates the relative outcoupled power as a function of detuning from the Bragg wavelength for a backward propagating wave with zero, one half, and one times the normalized magnitude as that of the forward propagating wave.

FIG. 5 illustrates the relative outcoupled power as a function of detuning from the Bragg wavelength for a backward propagating wave with 0, ½, and 1 times the normalized magnitude of the forward propagating wave. Initially when only the laser section in FIG. 1 is biased the outcoupler outcouples power reaching it from the laser section (forward propagation) with little or no backward coupled light. As the phase section is biased, the magnitude of the backward propagating wave increases. The counter propagating waves interfere in the outcoupler grating as discussed above. By an appropriate choice of currents to the phase section (with the laser section current fixed), the in-phase or out-of-phase condition of the standing wave with respect to the grating can be achieved. If the outcoupler grating is on-resonance, the outcoupled power approaches zero for the current that provides the out-of-phase state and is a maximum for the current that provides the in-phase state. This laser device, as shown in FIG. 1, can then be modulated by varying the phase section current values that result in-phase and 180 degrees out-of-phase operation. For typical index changes in InP based quantum well gain sections, a phase shift of $\pi$ (180 degrees) requires a length of approximately 75 µm and a current swing from 0 to <10 mA (consistent with the experimental data shown in FIG. 8).

Figure 6:
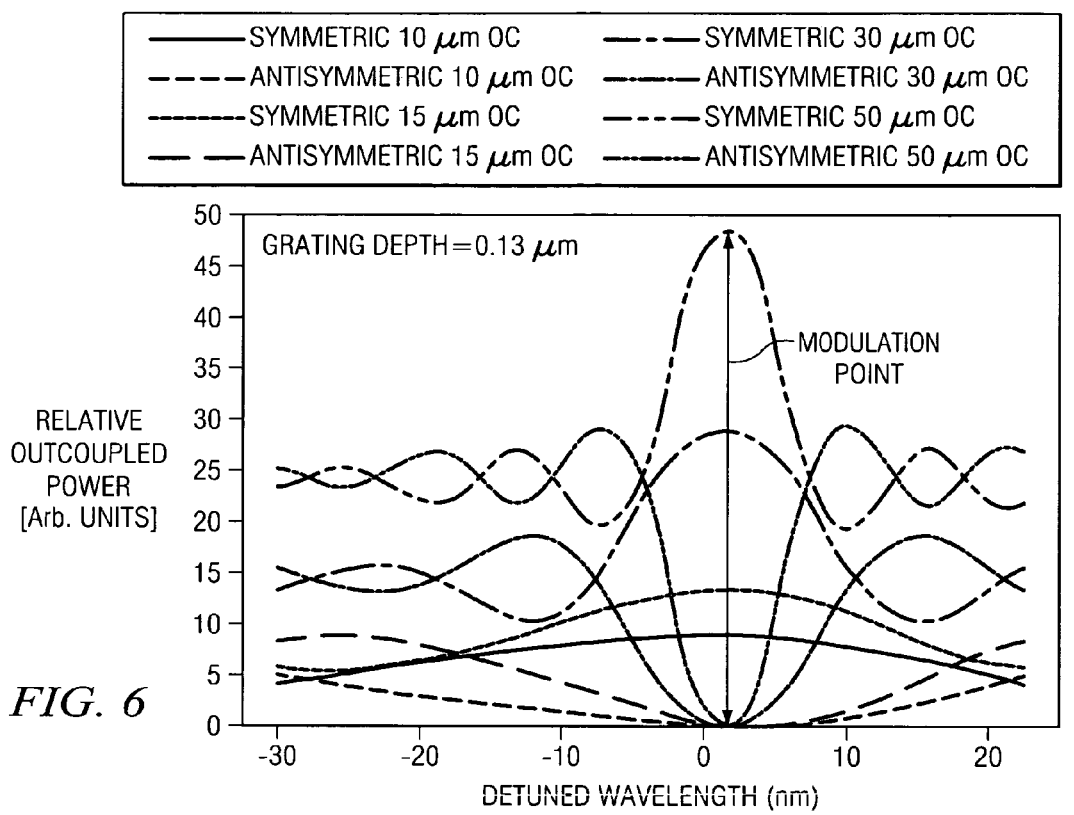
FIG. 6 illustrates the radiated power by the symmetric and antisymmetric mode for various outcoupler lengths as a function of detuning wavelength.

FIG. 6 illustrates the radiated power by the symmetric and antisymmetric mode for 10 µm, 15 µm, 30 µm, and 50 µm, long outcoupler lengths as a function of detuning wavelength.

Figure 7:
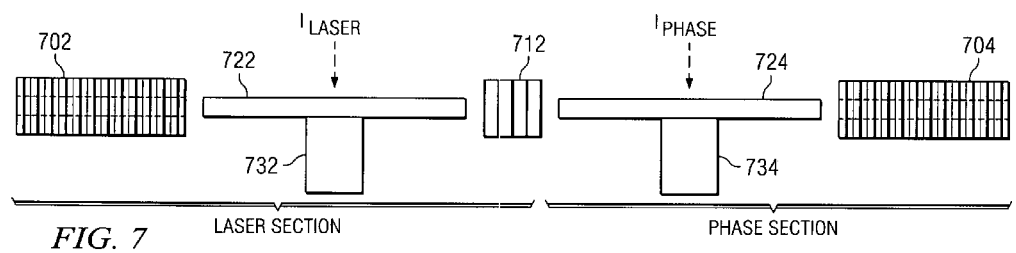
FIG. 7 illustrates an instance of the embodiment of the high speed grating-outcoupled surface emitting (GSE) semiconductor laser architecture.

FIG. 7 illustrates an instance of the embodiment of the high speed grating-outcoupled surface emitting (GSE) semiconductor laser architecture. The lasing section consists of a gain region and phase-shift section, both defined by an active ridge which is terminated at each end by narrow-band, first-order, shallow, distributed Bragg reflectors (DBR) 702, 704. The gain and phase-shift sections are separated by an outcoupler grating. DBRs 702, 704 are highly reflective (approximately 100 percent) to only a single Fabry Perot wavelength at each end of the ridge.

The lasing action takes place between the two DBRs 702, 704. A standing wave, which results from repeated interference of two counter propagating waves of identical frequency, is formed inside the lasing cavity 722 by applying the laser current, $I_{LASER}$, to ridge 722 through contact pad 732.

The second-order grating 712 outcouples the incident radiation into the air as well as into the substrate. The phase section of this GSE laser device also consists of a ridge region that excites the outcoupler end via DBR 704 opposite to DBR 702, both with the same grating period.

This GSE device is modulated as follows. First, the lasing section ridge is biased to a fixed current, $I_{LASER}$ (Ibias), above the lasing section threshold. The laser current, $I_{LASER}$, is applied to ridge 722 through contact pad 732. Next, the laser is modulated by varying the current, $I_{PHASE}$, of the phase section ridge 724 between two current correspond to in-phase and out-of-phase operation in the outcoupler grating. The phase current, $I_{PHASE}$, is applied to ridge 724 through contact pad 734. As the relative phase between the counter propagating waves 15 varies inside the outcoupler region, the relative position of the standing wave changes with respect to the outcoupler grating teeth. This standing wave forms due to the repeated interference of the counter propagating wave. As the standing wave moves from an in-phase to an out-of-phase position with respect to the grating teeth, the outcoupled power peaks or nulls respectively.

Figure 8:
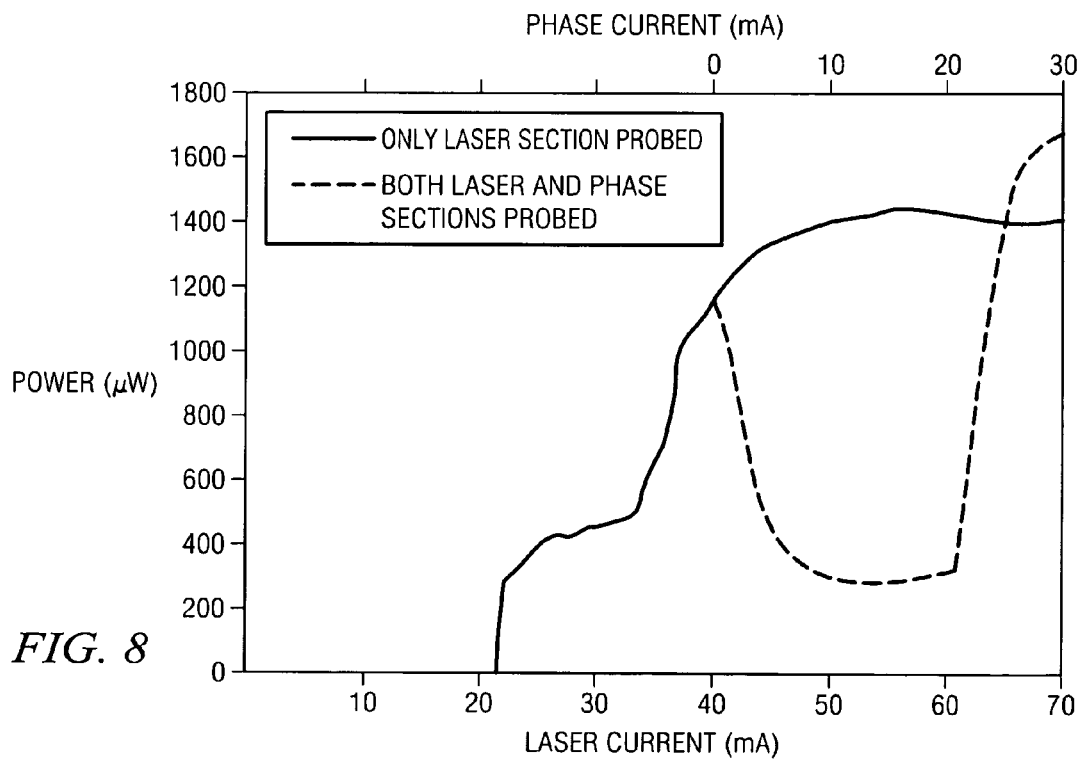
FIG. 8 illustrates outcoupled power versus current in accordance with an exemplary embodiment of the present invention.

FIG. 8 illustrates the outcoupled power (mW) versus current (mA). The curve that corresponds to "both laser and phase section probed" has the current to the laser section fixed at 40 mA. A variation in current in the phase section changes the relative phase, thus reducing the outcoupled power. In this example, the GSE laser device may be biased at 40 mA and modulated by varying the phase section current by 5 mA.

Figure 9:
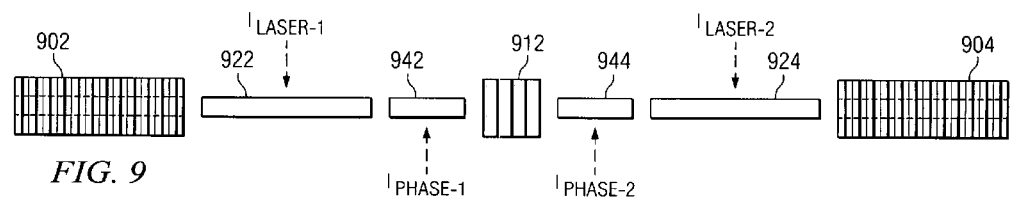
FIG. 9 illustrates a high speed grating-outcoupled surface emitting (GSE) semiconductor laser architecture in accordance with another exemplary embodiment of the present invention.

FIG. 9 illustrates a high speed grating-outcoupled surface emitting (GSE) semiconductor laser architecture in accordance with another exemplary embodiment of the present invention. The lasing section consists of a gain region defined by active ridges 922, 924, 942, 944 which are terminated at each end by narrow-band, first-order, shallow, distributed Bragg reflectors (DBR) 902, 904. DBRs 902, 904 are highly reflective (approximately 100%, for example) to only a single wavelength at each end of the ridge. The lasing action takes place between the two DBRs 902, 904 as a standing wave, which results from repeated interference of two counter propagating waves of identical frequency being formed inside the lasing cavity by applying the laser current $I_{LASER-1}$ to ridge 922 and laser current $I_{LASER-2}$ to ridge 924. The laser currents may (or may not) be tied together such that $I_{LASER-1}=I_{LASER-2}$.

The second-order outcoupler grating 912 is placed between the reflective distributed Bragg reflectors 902 and 904. This second-order grating 912 converts the incident power into output radiation into the air as well as into the substrate.

The laser is modulated by varying the phase currents $I_{PHASE-1}$ and $I_{PHASE-2}$ applied to ridges 942, 944. The phase current $I_{PHASE-1}$ may be used, for example to adjust the phase to optimize power. The phase current $I_{PHASE-2}$ may be used, for example to adjust the phase to turn the laser on and off by making the standing wave symmetric or antisymmetric with respect to the outcoupler gratings. As the relative phase between the counter propagating waves varies inside the outcoupler region, the relative position of the standing wave changes with respect to the outcoupler grating teeth. As the standing wave moves from an in-phase to an out-of-phase position with respect to the grating teeth, the outcoupled power peaks or nulls respectively.

Phase Shift Modulation

The sections above describe intensity modulation. A phase shift modulated output, instead of an intensity modulated output, may be obtained from each of the devices described above if the outcoupler grating is detuned approximately −15 nm or approximately +18 nm. In this case, the outcoupled intensity of the GSE laser does not change with current to the phase shift modulator (see FIG. 4), but the phase of the emitted light changes. Such phase shift modulation can provide increased spectral efficiency, but may require sophisticated heterodyne optical receivers that, currently, have not yet been fully developed.

What is claimed is:

1. A method for high speed intensity modulation in a grating-outcoupled surface emitting laser device, the method comprising:

applying a laser current to a first section in the grating-outcoupled surface emitting laser device to produce a standing wave that is substantially symmetric with respect to outcoupler grating teeth of the grating-outcoupled surface emitting laser device; and applying a phase current to a second section in the grating-outcoupled surface emitting laser device to vary the phase of counter-propagating waves between two values such that the counter-propagating waves alternate between in-phase and out-of-phase, the standing wave moves between a symmetric position and an antisymmetric position, and outcoupled light intensity is varied from a peak value to a null value.

2. The method of claim 1, wherein the outcoupler grating is operated on resonance.

3. The method of claim 1, further comprising:
applying a power optimization current to a power optimization section in the grating-outcoupled surface emitting laser device to optimize power of outcoupled light.

4. The method of claim 1, wherein the phase of the counter-propagating waves is varied between in-phase and 180 degrees out-of-phase.

5. A grating-outcoupled surface emitting laser device comprising:
a built-in horizontal waveguide;
a second order grating within the horizontal waveguide, wherein the second order grating outcouples light;
a laser section within the horizontal waveguide, wherein a bias current is applied to the laser section to generate a standing wave that is substantially symmetric with respect to outcoupler grating teeth of the second order grating; and
a phase section within the horizontal waveguide, wherein a phase current is applied to the phase section and wherein the phase current is varied between two values such that the counter-propagating waves alternate between in-phase and out-of-phase, the standing wave moves between a symmetric position and an antisymmetric position, and outcoupled light intensity is varied from a peak value to a null value.

6. The grating-outcoupled surface emitting laser device of claim 5, wherein the laser section includes:
a first highly reflective reflector at a first end of the horizontal waveguide;
a partially reflective reflector; and
a laser section ridge positioned between the first highly reflective reflector and the partially reflective reflector, wherein the bias current is applied to the laser section ridge.

7. The grating-outcoupled surface emitting laser device of claim 6, wherein the first highly reflective reflector is substantially 100% reflective.

8. The grating-outcoupled surface emitting laser device of claim 6, wherein the first highly reflective reflector is a distributed Bragg reflector.

9. The grating-outcoupled surface emitting laser device of claim 6, wherein the partially reflective reflector is substantially 30% reflective.

10. The grating-outcoupled surface emitting laser device of claim 6, wherein the phase section includes:
a second highly reflective reflector at a second end of the horizontal waveguide; and
a phase section ridge positioned between the partially reflective reflector and the second highly reflective reflector, wherein the phase current is applied to the phase section ridge.

11. The grating-outcoupled surface emitting laser device of claim 9, wherein the second highly reflective reflector is substantially 100% reflective.

12. The grating-outcoupled surface emitting laser device of claim 9, wherein the second highly reflective reflector is a distributed Bragg reflector.

13. A grating-outcoupled surface emitting laser device comprising:
a built-in horizontal waveguide;
a second order grating within the horizontal waveguide, wherein the second order grating outcouples light;
at least a first laser ridge within the horizontal waveguide, wherein a first bias current is applied to the first laser ridge to generate a standing wave that is substantially symmetric with respect to outcoupler grating teeth of the second order grating;
a first phase ridge within the horizontal waveguide, wherein a first phase current is applied to the first phase ridge to optimize peak power of outcoupled light; and
a second phase ridge within the horizontal waveguide, wherein a second phase current is applied to the second phase ridge and wherein the second phase current is varied between two values such that the counter-propagating waves alternate between in-phase and out-of-phase, the standing wave moves between a symmetric position and an antisymmetric position, and outcoupled light intensity is varied from a peak value to a null value.

14. The grating-outcoupled surface emitting laser device of claim 13, further comprising:
a first highly reflective reflector at a first end of the horizontal waveguide; and
a second highly reflective reflector at a second end of the horizontal waveguide.

15. The grating-outcoupled surface emitting laser device of claim 14, wherein the first highly reflective reflector and the second highly reflective reflector is substantially 100% reflective.

16. The grating-outcoupled surface emitting laser device of claim 14, wherein the first highly reflective reflector and the second highly reflective reflector is a distributed Bragg reflector.

* * * * *